United States Patent

Niiori et al.

[11] Patent Number: 5,962,374
[45] Date of Patent: Oct. 5, 1999

[54] PREPARATION OF OXIDE CRYSTALS

[75] Inventors: Yuusuke Niiori, Inuyama; Yasuji Yamada, Nagoya; Junichi Kawashima, Nagoya; Izumi Hirabayashi, Nagoya, all of Japan

[73] Assignee: International Superconductivity Technology Center, Japan

[21] Appl. No.: 09/027,065

[22] Filed: Feb. 20, 1998

[30] Foreign Application Priority Data

Feb. 21, 1997 [JP] Japan ................................. 9-038009

[51] Int. Cl.$^6$ .............................. C30B 9/12; C30B 15/00; C04B 35/653
[52] U.S. Cl. ...................... 505/450; 505/451; 505/729; 117/36; 117/73; 117/78; 117/79
[58] Field of Search ...................... 505/450, 451, 505/236, 729; 117/36, 78, 79, 73, 74

[56] References Cited

U.S. PATENT DOCUMENTS 5,602,081  2/1997  Nakamura et al. ................... 505/451
5,851,956  12/1998 Namikawa et al. ................... 505/450

FOREIGN PATENT DOCUMENTS 1-148796  6/1989  Japan .
4-214096  8/1992  Japan .

OTHER PUBLICATIONS

"The Growth of Single Crystals", R.A. Laudise (1970) pp. 293–316 No Month.

"Handbook of Crystal Growth" vol. 2, D.T.J. Hurle, (1994) pp. 565–607 No Month.

Primary Examiner—Mark Kopec
Attorney, Agent, or Firm—Wall Marjama Bilinski & Burr

[57] ABSTRACT

A process for preparing an oxide crystal by means of solution growth in the presence of a solvent is provided. The solvent includes a mixture of an oxide containing at least one member of those elements which constitute the oxide crystal, a halide containing at least one member of those elements which constitute the oxide crystal, and metallic silver.

16 Claims, 2 Drawing Sheets

PREPARATION OF OXIDE CRYSTALS

BACKGROUND OF THE INVENTION AND RELATED ART STATEMENT

The present invention relates to a process for the preparation of oxide crystals by means of solution growth. More particularly, the invention relates to a process for preparing, at low temperature, superconductive crystals and analogues having the same crystal structure as do the first-mentioned crystals. Further, the present invention relates to a process for the preparation of oxide crystals, in which superconductive crystals and analogues having the same crystal structure can be produced on a metallic silver substrate.

In preparing high-temperature superconductive oxide crystals and their analogous crystals through solution growth, it is known that stable, large crystals of high quality can be obtained with use of, as a solvent, an oxide melt (a self-flux) of those elements which constitute an oxide crystal to be desired or a melt of mixture consisting of an oxide of those elements which constitute an oxide crystal to be desired and an halide of those elements which constitute an oxide crystal to be desired.

As for the solution growth of crystals, the temperature at which a crystal proceeds to grow is always higher than the temperature at which a solution melts. When a solvent and a solute are held in eutectic relation to each other (in general, a solvent for use in solution growth forms together with a solute an eutectic system), the lower the melt temperature of the solvent is, the melt temperature of the resulting solution becomes lower. In the case of conventional processes for preparing high-temperature superconductive oxide crystals by use of an oxide melt as a solvent, and also for preparing oxide crystals analogous to the first-mentioned crystals by means of solution growth, the melt temperature of the solvent is substantially equal to the eutectic temperature of the mating solute. This is taken to mean that the melt temperature of the conventional oxide solvent is the lowest possible or otherwise critical temperature in a known mode of solution growth using a conventional oxide melt.

In the formation of a $YBa_2Cu_3O_{6+d}$ crystal that is one typical example of high-temperature superconductive oxide crystals, the temperature of crystal growth reaches 970° C. even in its low limit when a 3BaO-5CuO oxide is used as a solvent. Besides, the temperature of crystal growth reaches 920° C. in its low limit when a $3Ba(O+F_2)$-5CuO, which is a mixture of an oxide and a halide, is used as a solvent.

Many attempts have been made by the use of certain different solvents, say an oxide melt containing anionic elements other than the elements making up a desired oxide crystal, and halide melt. Most instances, however, fail to achieve adequate crystal growth or provide a crystal as desired, or to produce a crystal involving impure anionic elements. Further, there is a problem that a metallic silver substrate dissolves in a solvent containing an oxide and a halide when the substrate is immersed in the solvent at 925° C. so as to grow high-temperature superconductive oxide crystals on the metallic silver substrate.

SUMMARY OF THE INVENTION

In view of the foregoing problems of the prior art, an object of the present invention is to provide a process for preparing an oxide crystal which enables the temperature of crystal growth to be reduced or lowered to so an extent as to utilize not only low-melting materials such as metallic silver and the like that have heretofore been unacceptable for use, but also materials that are unstable at high temperatures.

Another object of the present invention is to provide a process for preparing an oxide crystal, which controls dissolution of a metallic silver substrate in a solvent and which can grow superconductive oxide crystals on the metallic silver substrate.

According to the present invention, there is provided a process for preparing an oxide crystal by means of solution growth in the presence of a solvent, the solvent comprising a mixture of an oxide containing at least one member of those elements which constitute the oxide crystal, a halide containing at least one member of those elements which constitute the oxide crystal, and metallic silver.

DETAILED DESCRIPTION OF THE PREFERRED EMBODIMENT

Figure 1:
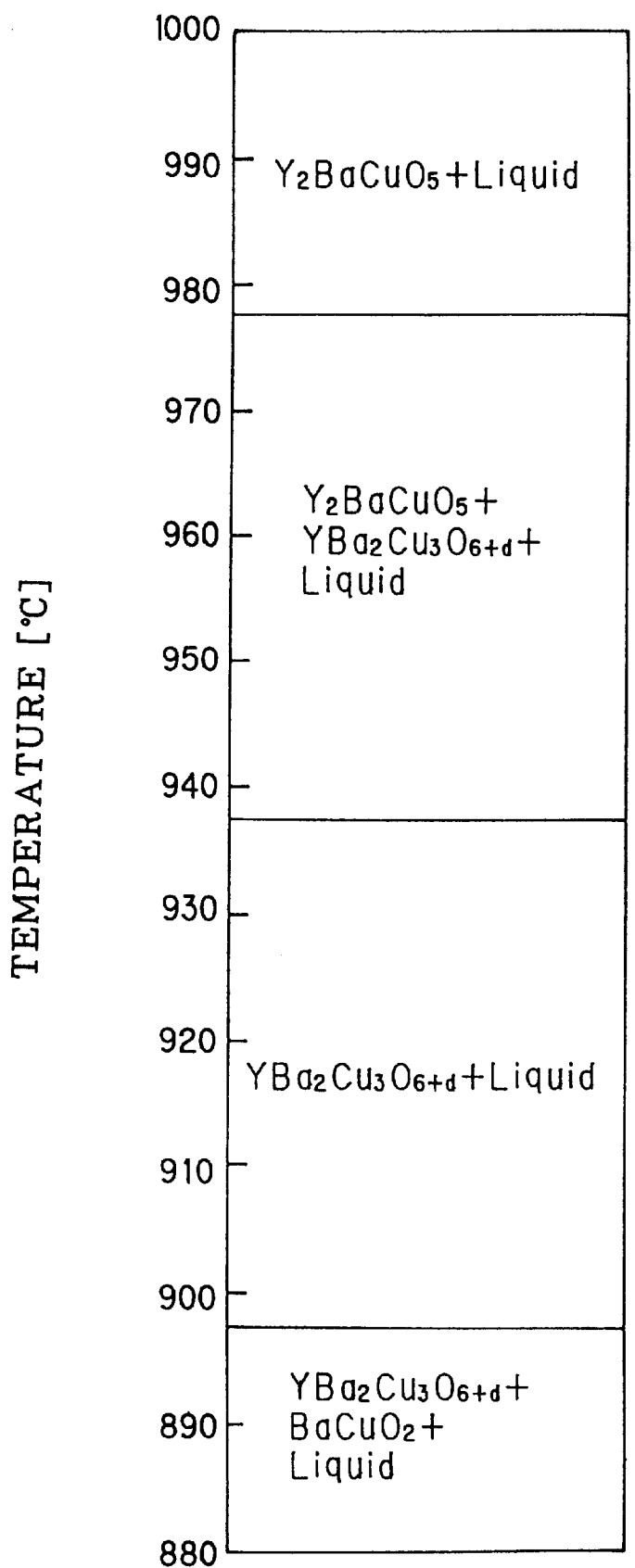
FIG. 1 shows the temperature range of crystal growth of a Y123 crystal in Example 1.

The present invention will hereinbelow described specifically.

To prepare high-temperature superconductive oxide crystals or their analogues by means of solution growth as of a solution standing cooling method (a flux method), a top seeded solution growth method (a TSSG method), a traveling solvent floating zone method (a TSFZ method) or the like, the invention contemplates using, as a solvent for solution preparation, a solvent composed of, for example, an oxide solvent such as Ba—Cu—O—F for forming a $YBa_2Cu_3O_{6+d}$ crystal, a halide, and metallic silver. Adding metallic silver to the solvent containing an oxide and a halide makes crystal growth possible at lower temperatures. Additionally, saturation of metallic silver for a solvent containing an oxide and a halide prevent dissolution of a metallic silver substrate in the solvent and makes possible crystal growth of high-temperature superconductive oxide crystals or related crystals thereof on the metallic silver substrate.

Oxide crystals accruing from the present invention include superconductive crystals of the so-called Y123 crystal structure, such as a $YBa_2Cu_3O_{6+d}$ crystal and the like, and analogous crystals having the same crystal structure as the first-mentioned crystals do.

The oxide crystals stated above are typified by those having a composition of $(RE_{1-x}RE'_x)Ba_2Cu_3O_{6+d}$ ($0 \leq x \leq 1.0$) where RE and RE' are different from each other, and RE and RE' each are either one anionic element selected from among Y, Ca, La, Pr, Nd, Sm, Eu, Gd, Dy, Ho, Er, Tm, and Yb, and those having a composition of $RE_{1+x}Ba_{2-x}Cu_3O_{6+d}$ ($0 \leq x \leq 1.0$) where RE is either one anionic element selected from among Y, Ca, La, Pr, Nd, Sm, Zu, Gd, Dy, Ho, Er, Tm and Yb.

The solvent eligible for the present invention comprises as one of its components an oxide that contains at least one of the elements constituting a desired oxide crystal. To be more specific, the oxide is such containing at least one anionic element chosen from Ba, Cu, Y, Ca, La, Pr, Nd, Sm, Eu, Gd, Dy, Ho, Er, Tm and Yb as already described as the constituent elements of the oxide crystal. For example, a mixture of BaO—CuO is preferable.

In addition to the above noted oxide, the solvent according to the invention comprises a halide that contains at least one of the elements constituting a desired oxide crystal. More specifically, the halide is such containing at least one anionic element chosen from Ba, Cu, Y, Ca, La, Pr, Nd, Sm, Eu, Gd, Dy, Ho, Er, Tm and Yb as already indicated as the constituent elements of the oxide crystal. The halide is composed of an alkali metal or an alkaline earth metal which may preferably be chosen from $BaF_2$, $BaCl_2$, $BaI_2$, $CaF_2$, $CaCl_2$, $CaI_2$, $SrF_2$, $SrCl_2$ and $SrI_2$.

In formulating a solvent that can be used to prepare a solution in the practice of the present invention, it is preferred that a given oxide and a given halide be mixed in a ratio of 0.1 to 50% in terms of the molar ratio of a halogen element relative to all the elements present in that solvent, preferably of 3 to 30%, more preferably of 5 to 15%. The reason is as follows:

When a molar ratio of halide relative to all the elements present in the solvent is lower than 0.1%, the temperature of crystal growth of oxide crystals is hardly lowered. When the molar ratio of halide is about 3%, a great amount of solvent is adhered on a surface of an obtained oxide crystals though the temperature of crystal growth of oxide is lowered. When the molar ratio is more than 30%, it sometimes happens that an oxide crystal to be produced and a halide may be co-crystallized. Further, when the molar ratio exceeds 50%, surplus halide remains as a solid phase because a solution is saturated with halide, and growth of the oxide crystal is remarkably hindered. When the molar ratio is in the range from 5% to 15%, a wettability of an obtained oxide crystal and the solvent are low, and a co-crystallization of an unexpected crystal is not recognized. Thus, an oxide crystal having the best quality can be produced.

Further, the molar ratio of metallic silver relative to all the elements present in the solvent is within the range from 0.4% to 11.0%, preferably from 0.5% to 7.9%, and more preferably 2.9%–6.2%. A solvent obtained with the mixture ratio within the above range can lower the temperature of crystal growth.

Commonly known in the art are a solution standing cooling method (a flux method), a top seeded solution growth method (a TSSG method), a traveling solvent floating zone method (a TSFZ method) and the like that may be suitably employed as a mode of crystal growth according to the present invention. These methods are disclosed for instance in "Advanced Electronics Series I-4, Category I: Electronic Materials, Properties and Devices", Takuo Sugano et al.; "Technology of Bulk Crystal Growth", Keigo Hikawa, Baifukan Publishing Co., May 20, 1994; "Handbook of Crystal Growth", Elsevier Science Publishers, 1993; and "Physical Engineering Experiment 12: Basic Technology of Crystal Growth", 2nd Ed., Shinichiro Takase, Tokyo University Publishing Institute, May 20, 1980.

Each of the above methods is outlined hereunder. By the solution standing cooling method (the flux method) is meant a method in which a solid phase to be desired is dissolved in a suitable solvent and then cooled in quietly slow condition for subsequent crystallization by taking advantage of the variations in temperature depending on varying solubilities. This method is advantageous in that it allows for crystal growth to be carried out at low temperature as contemplated to be attained by the present invention. In such a crystal as of a Y123 crystal that undergoes melting upon decomposition and hence needs cooling out of a certain temperature exceeding the decomposition temperature, those inclusions induced from a crystallization reaction are necessarily drawn into the resulting crystal. The unique solvent according to the invention is highly conductive to a single crystal free from inclusions tending to take place in a region of temperatures lower than the decomposition temperature.

The top seeded solution growth method (the TSSG method) is devised such that crystal growth is selectively commenced at from a seed crystal brought into contact with the surface of a solution which has been prepared by the use of a solvent for lowering the temperature of crystal growth, and such crystal growth is continuously effected while a growing crystal is being upwardly taken. The TSSG method is generally classified into two modes. One or first mode lies in lifting a crystal with cooling, while the other or last mode takes up a crystal out of a solution maintained with a temperature gradient and without temperatures varied with time. The first mode is so constructed as to start crystal growth at a nucleus put in place on the solution surface in the above solution standing cooling method. The last mode is called a temperature differential top seeded solution growth method, and in this mode, crystal growth is retained since a solute is being transported to a growing crystal from a starting material charged at a bottom portion of a crucible. The top seeded solution growth method warrants greater crystal diameters with use of crucibles of larger dimensions.

The traveling solvent floating zone method is the improved floating zone method. The TSFZ method is such in which a rod-like specimen vertically disposed is partially locally heated to define a floating zone that is thereafter traveled to form a single crystal. When taken with the floating zone placed as a boundary, the rod has a growing crystal at one of its ends and a starting material at the opposite end. As the floating zone travels, a crystal grows to correspond to a quantity of the rod having melted. The TSFZ method has been frequently desirable for high-melting materials and also widely acceptable for the formation of crystals that may pose adverse reactions with the associated crucibles. As previously discussed in connection with the solution standing cooling method, those materials which melt upon decomposition require use of a solvent. A method modified in its floating zone to be made up of a solvent is the traveling solvent floating zone method. With the TSFZ method provided, an elongate single crystal in principle can be formed since a starting material is supplied out of a starting material rod so as to replenish the amount of a crystal grown.

EXAMPLES

The present invention is hereinbelow described on the basis of Examples. However, the present invention is by no means limited to these Examples.

Example 1

An oxide crystal having a Y123 crystal structure was grown using a solvent containing an oxide, a halide, and metallic silver. First, 100 g of $YBa_2Cu_3O_{6+d}$(Y123), 94 g of BaO, 92 g of CuO, and 15 g of $BaF_2$ were put in a yttria crucible and heated at 900° C.–1000° C. in an electric furnace so as to obtain a solution for crystal growth. Further, the solution was kept at 925° C. so as to dissolve metallic silver gradually. When the amount of added metallic silver reached 22 g, the solution was saturated. Then, a surface temperature of the solution was changed, and simultaneously, growth of the Y123 crystal was tried by a TSSG method to obtain a temperature range of Y123 crystal growth. A seed crystal was a Y123 crystal film formed on a MgO substrate by a pulsed laser deposition method (a PLD method). The film was brought into contact with a surface of the liquid and rotated at a speed of 100 rpm to grow a Y123 crystal for 10 minutes. As shown in FIG. 1, a temperature range of initial crystal growth of Y123 was from 898° C. to 937° C.

Figure 2:
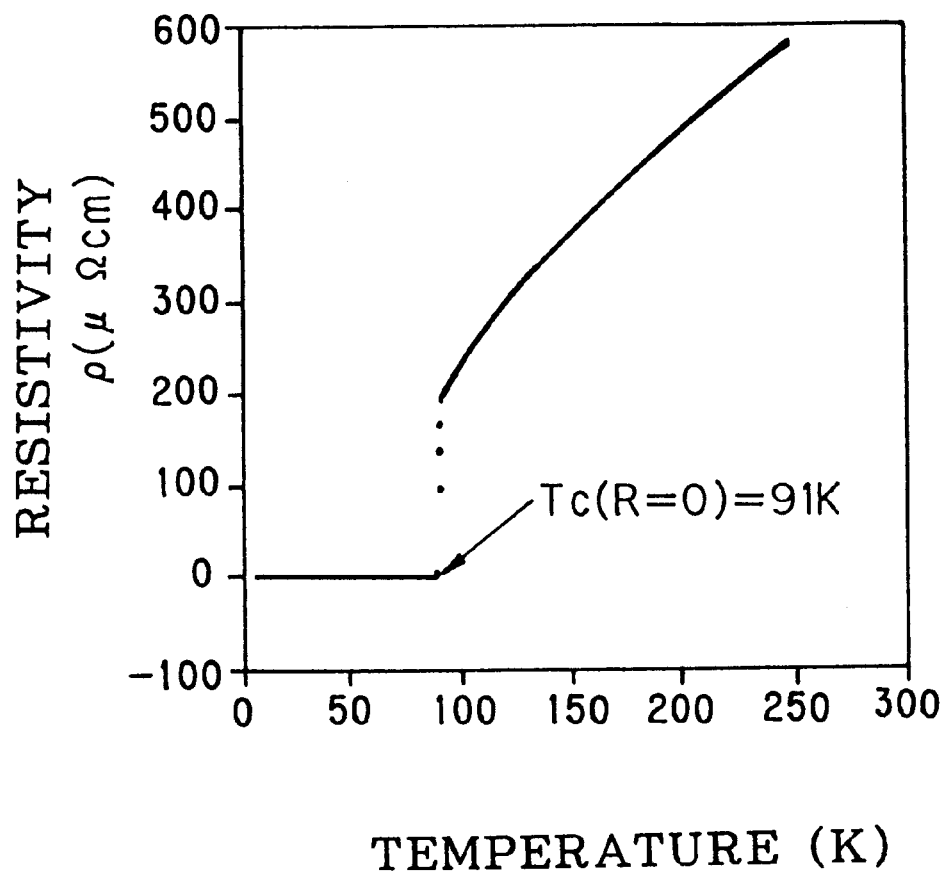
FIG. 2 is a graph showing a temperature change of a resistivity of a crystal obtained in Example 1 in an oxygen current after annealing.

FIG. 2 shows a temperature change of a resistivity of the crystal obtained above in an oxygen current after annealing. As shown in FIG. 2, the obtained crystal is superconductive at a temperature of 91K or lower, and it is clear that the obtained crystal is $YBa_2Cu_3O_{6+d}$ as intended.

Incidentally, an amount of metallic silver added to the solvent is desirably 0.5% or more, because an effect of the addition is small when the amount is less than 0.4%. Even if more than a saturation amount of metallic silver is added (about 5.1%), temperature of crystal growth is not particularly changed. However, surplus metallic silver precipitated at the bottom of the solution covers Y123 crystals put at the bottom of the crucible and hinder diffusion of Y. Therefore, when more than 7.9% of metallic silver is added to the solvent, it shows a tendency to extremely slow down the crystal growth. When more than 11% of metallic silver is added to the solvent, the Y123 crystal did not grow at all. This indicates that an amount of metallic silver to be added is preferably 2.9%–6.2%, which is about the saturation amount. On the other hand, when a crystal was grown without metallic silver, a temperature range of initial-crystal growth of Y123 was from 922° C. to 970° C. This shows that addition of metallic silver to a Ba—Cu—O—F solvent, which is a mixture solvent of an oxide and a halide, can lower the temperature of growth of an oxide crystal, $YBa_2Cu_3O_{6+d}$.

Example 2

A surface temperature of a solvent was kept at 925° C. under the conditions of crystal growth as in Example 1. Growth of Y123 crystal on a metallic silver single crystal substrate was tried under the condition that the solution was saturated with the metallic silver. A seed crystal was a Y123 crystal film formed on a metallic silver substrate by a pulse laser deposition method (a PLD method). The film was brought into contact with a surface of the liquid and rotated at a speed of 100 rpm to grow a Y123 crystal for 10 minutes. As a result, the metallic silver substrate was not dissolved, and growth of a Y123 crystal was recognized on the substrate. The obtained crystal was recognized as an intended $YBa_2Cu_3O_{6+d}$ by an energy dispersion X-ray analysis (EDS analysis). When a temperature change of magnetic susceptibility was measured by SQUID after annealing in an oxygen current, the obtained crystal was recognized as a superconductive body having a critical temperature Tc of 85K. On the other hand, when crystal growth was tried without adding metallic silver, a metallic silver single crystal substrate was dissolved in a Ba—Cu—O—F solvent, and it was impossible to grow $YBa_2Cu_3O_{6+d}$ crystal on the metallic silver substrate.

Example 3

An oxide crystal having a Nd123 crystal structure was grown using a solvent containing an oxide, a halide, and metallic silver. First, 100 g of $NdBa_2Cu_3O_{6+d}$(Nd123), 94 g of BaO, 92 g of CuO, and 15 g of $BaF_2$ were put in a neodya crucible and heated at 950° C.–1050° C. in an electric furnace to obtain a solution for crystal growth. The solution was then kept at 925° C., and metallic silver was added to the solution until the solution was saturated with the metallic silver. Growth of a Nd123 crystal was tried by a TSSG method this solution. A seed crystal was a Nd123 crystal film formed on a MgO substrate by a PLD method. The film was brought into contact with a surface of the liquid and rotated at a speed of 100 rpm to grow a Nd123 crystal for 10 minutes. As a result, growth of the Nd123 crystal was recognized at 900° C., and its growing speed was about 0.2 $\mu$m/min.

According to the present invention, as described above, a temperature of crystal growth can be lowered in a preparation of an oxide crystal through solution growth. Further, a superconductive crystal can be grown on a metallic silver substrate.

What is claimed is:

1. A process for preparing an oxide crystal by means of solution growth in the presence of a solvent, said solvent comprising a mixture of an oxide containing at least one member of those elements which constitute said oxide crystal, a halide containing at least one member of those elements which constitute said oxide crystal, and metallic silver.

2. The process according to claim 1, wherein said oxide crystal is selected from the group consisting of a superconductive crystal and a non-superconductive crystal having the same crystalline structure as that of a Y123 superconductor.

3. The process according to claim 1, wherein said oxide crystal has a crystal structure of a Y123 superconductor.

4. The process according to claim 1, wherein said oxide crystal has a composition of $(RE_{1-x}RE'_x)Ba_2Cu_3O_{6+d}$ where RE and RE' are different from each other, and RE and RE' each are either one anionic element selected from the group consisting of Y, Ca, La, Pr, Nd, Sm, Eu, Gd, Dy, Ho, Er, Tm, and Yb, and ($0 \leq x \leq 1.0$).

5. The process according to claim 1, wherein said oxide crystal has a composition of $RE_{1+x}Ba_{2-x}Cu_3O_{6+d}$ where RE is one anionic element selected from the group consisting of Y, Ca, La, Pr, Nd, Sm, Zu, Gd, Dy, Ho, Er, Tm and Yb, and ($0 \leq x \leq 1.0$).

6. The process according to claim 1, wherein said oxide contains at least one anionic element selected from the group consisting of Y, Ca, La, Pr, Nd, Sm, Eu, Gd, Dy, Ho, Er, Tm, and Yb.

7. The process according to claim 1, wherein said oxide comprises a mixture of BaO—CuO.

8. The process according to claim 1, wherein said halide contains at least one anionic element selected from the group consisting of Y, Ca, La, Pr, Nd, Sm, Eu, Gd, Dy, Ho, Er, Tm, and Yb.

9. The process according to claim 1, wherein said halide contains one member selected from the group consisting of alkali metals and alkaline earth metals.

10. The process according to claim 9, wherein said halide is selected from the group consisting of $BaF_2$, $BaCl_2$, $BaI_2$, $CaF_2$, $CaCl_2$, $CaI_2$, $SrF_2$, $SrCl_2$ and $SrI_2$.

11. The process according to claim 1, wherein said oxide and said halide are mixed in a ratio of 0.1 to 50% in terms of the molar ratio of a halogen element relative to all the elements present in said solvent.

12. The process according to claim 1, wherein said oxide and said halide are mixed in a ratio of 3 to 30% in terms of the molar ratio of a halogen element relative to all the elements present in said solvent.

13. The process according to claim 1, wherein said oxide and said halide are mixed in a ratio of 5 to 15% in terms of the molar ratio of a halogen element relative to all the elements present in said solvent.

14. The process according to claim 1, wherein said oxide, said halide, and said metallic silver are mixed in a ratio of 0.4 to 11.0% in terms of the molar ratio of metallic silver relative to all the elements present in said solvent.

15. The process according to claim 1, wherein said oxide, said halide, and said metallic silver are mixed in a ratio of 0.5 to 7.9% in terms of the molar ratio of metallic silver relative to all the elements present in said solvent.

16. The process according to claim 1, wherein said oxide, said halide, and said metallic silver are mixed in a ratio of 2.9 to 6.2% in terms of the molar ratio of metallic silver relative to all the elements present in said solvent.

* * * * *